United States Patent
Chu

(10) Patent No.: US 8,138,853 B2
(45) Date of Patent: Mar. 20, 2012

(54) FRONT-END ARCHITECTURE OF RF TRANSCEIVER AND TRANSCEIVER CHIP THEREOF

(75) Inventor: Chun Hsueh Chu, Hsinchu County (TW)

(73) Assignee: Ralink Technology Corporation, Hsinchu County (TW)

(*) Notice: Subject to any disclaimer, the term of this patent is extended or adjusted under 35 U.S.C. 154(b) by 280 days.

(21) Appl. No.: 12/471,039

(22) Filed: May 22, 2009

(65) Prior Publication Data

US 2010/0109798 A1     May 6, 2010

(30) Foreign Application Priority Data

Nov. 4, 2008    (TW) ................................. 97142447 A

(51) Int. Cl.
*H01P 1/10*     (2006.01)
*H03H 7/46*     (2006.01)

(52) U.S. Cl. ........................................ 333/101; 333/132

(58) Field of Classification Search ................. 333/25, 333/26, 101, 103, 132; 455/78, 80
See application file for complete search history.

(56) References Cited

U.S. PATENT DOCUMENTS

| 7,010,279 | B2* | 3/2006 | Rofougaran ................. 455/121 |
| 7,385,458 | B2* | 6/2008 | McKay et al. ................ 333/26 |
| 7,595,766 | B2* | 9/2009 | Rofougaran ................. 343/795 |
| 7,773,956 | B2* | 8/2010 | Fukamachi et al. ........... 455/78 |
| 2008/0204163 | A1* | 8/2008 | Royak et al. ................ 333/132 |

* cited by examiner

*Primary Examiner* — Dean O Takaoka
(74) *Attorney, Agent, or Firm* — WPAT, P.C.; Anthony King

(57) ABSTRACT

An RF front-end architecture is operated in either a transmitting or a receiving mode. The RF front-end architecture comprises an antenna, an impedance match network, a balun and a transceiver chip. The transceiver chip comprises first and second transmit/receive (TR) switches, a transmitter, and a receiver. Because two TR switches are integrated into the chip, the printed circuit board area, BOM cost and pin count of the transceiver chip can be greatly reduced.

8 Claims, 6 Drawing Sheets

FRONT-END ARCHITECTURE OF RF TRANSCEIVER AND TRANSCEIVER CHIP THEREOF

BACKGROUND OF THE INVENTION

1. Field of the Invention

The present invention relates to a circuit structure, and more particularly, to a highly-integrated front-end architecture of a radio frequency (RF) transceiver and the transceiver chip thereof.

2. Description of the Related Art

FIG. 1 shows a conventional front-end architecture of an RF transceiver. As shown, the front-end architecture 100 of an RF transceiver is disposed on a printed circuit board, which includes an antenna ANT, a transmit/receive (T/R) switch 11, a first impedance matching network 12 and a second impedance matching network 13, a first balance to unbalanced transformer (balun) 14 and a second balun 15, a receiver unit 161 and a transmitter unit 163, wherein the receiver unit 161 and the transmitter unit 163 are integrated in a transceiver chip 16. The receiver unit 161 includes a low noise amplifier (LNA) 162, which receives an RF signal through the antenna ANT. The transmitter unit 163 includes a power amplifier (PA) 164, which transmits an RF signal to the antenna ANT. In receiving mode, the T/R switch 11 selectively switches a transmission signal from the antenna ANT to the input end of the first impedance matching network 12. In transmitting mode, the T/R switch 11 selectively switches a transmission signal from the output end of the second impedance matching network 13 to the antenna ANT.

To achieve the best performance, in receiving mode the antenna ANT conducts an impedance matching with the input terminal of the receiver unit 161 through the first impedance matching network 12 and the first balun 14. In transmitting mode the antenna ANT conducts an impedance matching with the output terminal of the transmitter unit 163 through the second impedance matching network 13 and the second balun 15. If the antenna ANT cannot match impedance with the receiver unit 161 or with the transmitter unit 163 in either mode, the input signals are reflected to the point of origin, causing unnecessary power consumption. The baluns 14, 15 shown in FIG. 1 each transforms either a single-ended signal into a differential signal or a differential signal into a single-ended signal. For example, the first balun 14 is used to transform a single-ended signal of the first impedance matching network 12 into a differential signal across two input terminals of the low noise amplifier 162, and the second balun 15 is used to transform a differential signal across two output terminals of the low noise amplifier 164 into a single-ended signal of the second impedance matching network 13. The low noise amplifier 162 and the power amplifier 164 employ differential signal transmission to increase their immunity to noise.

The T/R switch 11 in FIG. 1 is implemented by gallium-arsenide (GaAs) technique. The known semi-insulative property of the GaAs material can largely reduce parasitic resistance in the base, thereby reducing insertion loss of the switch components. Although GaAs materials are suitable to high-frequency circuits, they still possess some drawbacks. For example, the yield of the GaAs process is relatively low and the manufacturing cost thereof is relatively high. In addition, such kind of technology cannot implement a system-on-chip structure, thus causing additional package and test expenses. Furthermore, two additional impedance matching networks 12, 13, and two baluns 14, 15, which are disposed outside the chip, are required to achieve impedance matching in different signal transmission paths. Those additional components occupy a large space and thus increase the materials cost. Therefore, there is an important need to design a highly-integrated circuit structure to reduce the area and cost of the printed circuit board.

SUMMARY OF THE INVENTION

The front-end circuit of a radio frequency (RF) transceiver in accordance with one embodiment of the present invention comprises an antenna, an impedance matching unit and a transceiver chip. The antenna is configured to transmit and receive an RF signal. The impedance matching unit is configured to convert the RF signal into a differential signal under a receiving mode or to convert a differential signal into the RF signal under a transmitting mode. The transceiver chip includes a receiver unit, a transmitter unit and at least one transmit/receive (T/R) switch, wherein the T/R switch transmits the differential signal from the impedance matching unit to the receiver unit under the receiving mode, and transmits the differential signal from the transmitter unit to the impedance matching unit under the transmitting mode.

The front-end circuit of an RF transceiver in accordance with one embodiment of the present invention comprises a first antenna, a first T/R switch, a transceiver chip, a first impedance matching unit, a second impedance matching unit and a third impedance matching unit. The first antenna and a second antenna are configured to selectively receive or transmit an RF signal. The first transmit/receive (T/R) switch is connected to the first antenna. The transceiver chip includes a receiver unit, a transmitter unit and at least one switch. The first impedance matching unit is configured to convert the RF signal of the first antenna into a first differential signal under a receiving mode of the first antenna and then to transmit the first differential signal to the receiver unit. The second impedance matching unit is configured to convert a second differential signal of the transmitter unit into the RF signal of the first antenna under a transmitting mode of the first antenna. The third impedance matching unit is configured to convert an RF signal of the second antenna into a third differential signal under a receiving mode of the second antenna and then to transmit the third differential signal to at least one switch, or to convert the third differential signal from at least one switch into the RF signal of the second antenna under a transmitting mode of the second antenna.

The front-end circuit of an RF transceiver in accordance with one embodiment of the present invention comprises a first antenna and a second antenna, a first T/R switch, a first impedance matching network, a second impedance matching network, a third impedance matching network and a transceiver chip. The first antenna and the second antenna are configured to selectively receive or transmit an RF signal. The first transmit/receive (T/R) switch is connected to the first antenna. The first impedance matching network is connected to the first T/R switch for matching a first input signal. The second impedance matching network is connected to the first T/R switch for matching a first output signal. The third impedance matching network is connected to the second antenna for matching a second input/output signal. The transceiver chip is configured to receive one of the first input signal and the second input/output signal under a receiving mode, and to transmit one of the first output signal and the second input/output signal under a transmitting mode.

The transceiver chip of a front-end circuit of an RF transceiver in accordance with one embodiment of the present invention includes a receiver unit, a transmitter unit and at least one T/R switch. The T/R switch transmits a differential signal from an impedance matching unit to the receiver unit under a receiving mode, and transmits a differential signal from the transmitter unit to the impedance matching unit under a transmitting mode.

BRIEF DESCRIPTION OF THE DRAWINGS

The invention will be described according to the appended drawings in which.

PREFERRED EMBODIMENT OF THE PRESENT INVENTION

Figure 1:
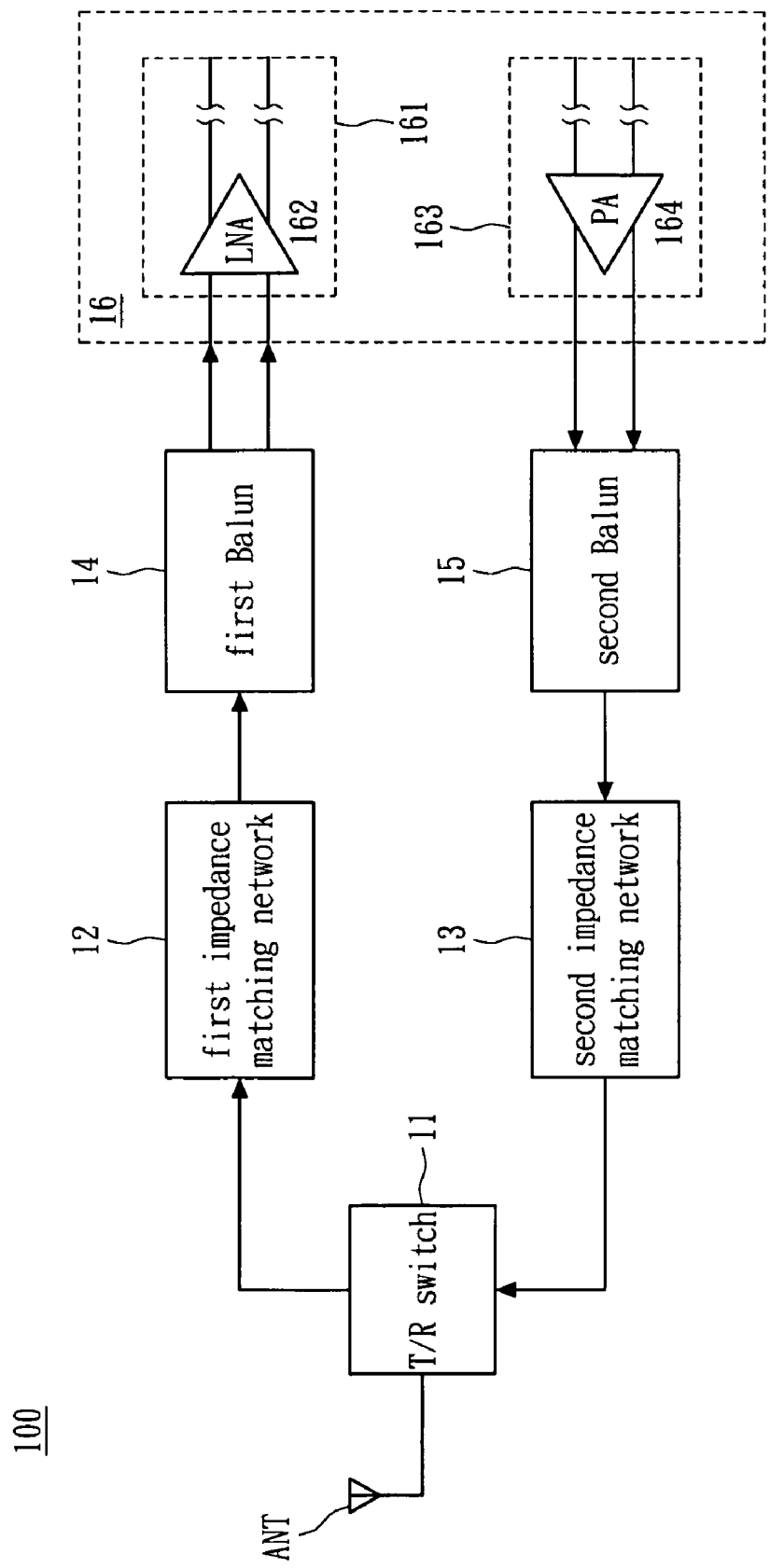
FIG. 1 shows a conventional front-end architecture of an RF transceiver.
Figure 2:
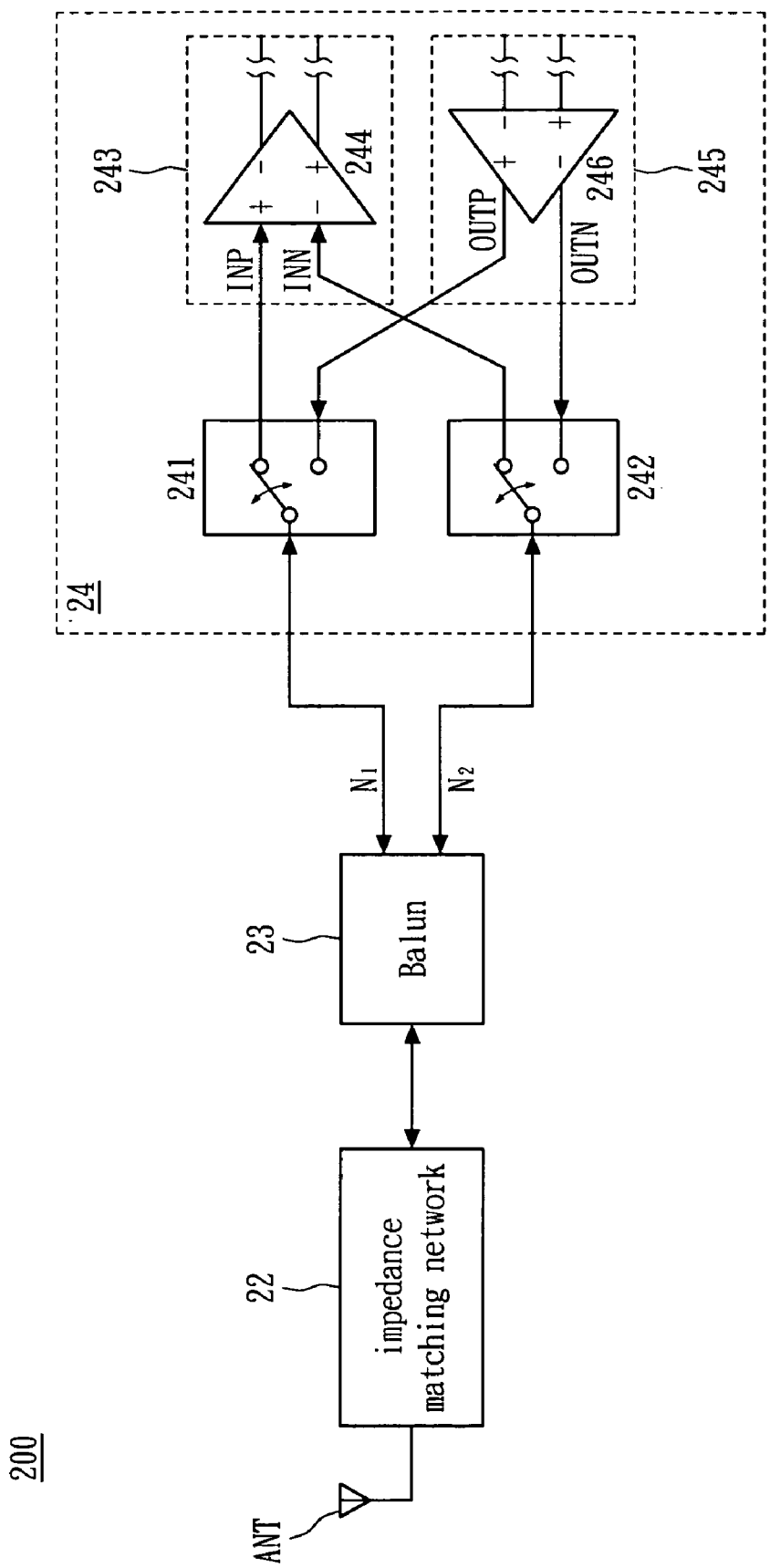
FIG. 2 shows a structure of a front-end circuit of an RF transceiver in accordance with one embodiment of the present invention.

FIG. 2 shows a structure of a front-end circuit of an RF transceiver in accordance with one embodiment of the present invention. Referring to FIG. 2, the front-end circuit 200 is disposed on a printed circuit board, and includes an antenna ANT, an impedance matching network 22, a balance to unbalanced transformer (balun) 23 and a transceiver chip 24. The transceiver chip 24 includes a first transmit/receive (T/R) switch 241 and a second T/R switch 242, a receiver unit 243 and a transmitter unit 245. The receiver unit 243 includes a low noise amplifier 244, which receives a differential input signal between a first input terminal INP and a second input terminal INN and generates a differential output signal. The transmitter unit 245 includes a power amplifier 246, which receives a differential input signal and generates a differential output signal between the first output terminal OUTP and the second output terminal OUTN. The first T/R switch 241 and the second T/R switch 242 can be implemented by a single pole dual throw (SPDT), which is composed of a single input/output terminal and two output/input terminals. As shown, the switches 241 and 242 are integrated in the chip 24. The impedance matching network 22 and balun 23 are placed between the antenna ANT and the transceiver chip 24. The impedance matching network 22 can be implemented by a transformer, resistors, capacitors or inductors. The balun 23 includes a first output node N1 and a second output node N2, which are separately coupled to the input terminals of the switches 241 and 242.

The front-end module 200 of an RF transceiver is operated in two modes, i.e. a receiving mode and a transmitting mode. Under the receiving mode, the receiver unit 243 receives RF signals from the antenna ANT. Therefore, the first T/R switch 241 selectively switches the first input/output terminal N1 of the balun 23 to the first input terminal INP of the low-noise amplifier 244, and the second T/R switch 242 selectively switches the second input/output terminal N2 of the balun 23 to the second input terminal INN of the low-noise amplifier 244. Under the transmitting mode, the transmitter unit 245 transmits RF signals to the antenna ANT. Therefore, the first T/R switch 241 selectively switches the first input/output terminal N1 of the balun 23 to the first output terminal OUTP of the power amplifier 246, and the second T/R switch 242 selectively switches the second input/output terminal N2 of the balun 23 to the second output terminal OUTN of the power amplifier 246. As such, the received RF signals do not interfere with the transmitted RF signals. In this embodiment, because the circuit structure needs only an impedance matching network and a balun, and the T/R switches can be integrated into the chip, the area of a printed circuit board, the material cost and the pin count are all reduced.

Figure 3:
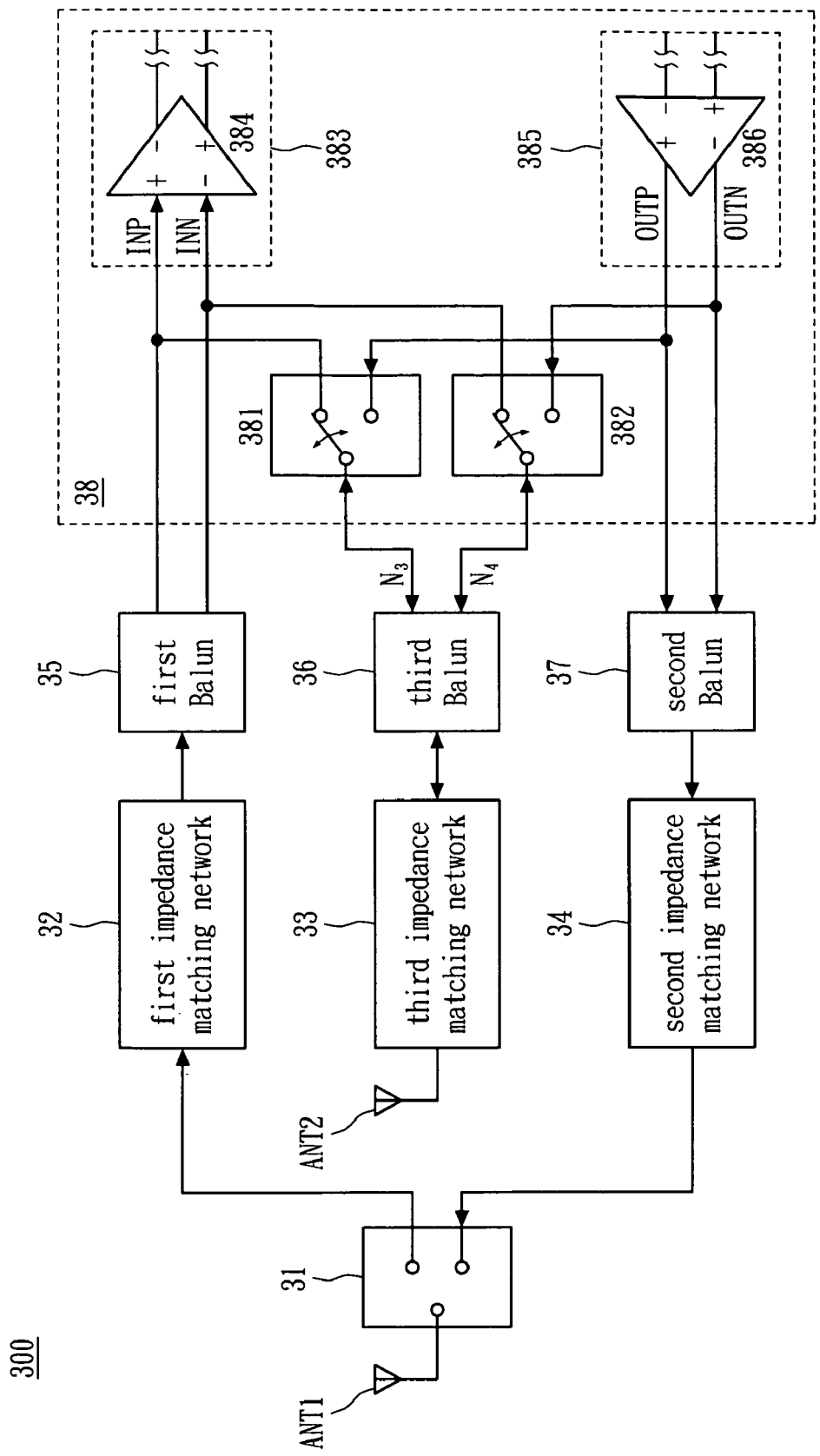
FIG. 3 shows another structure of a front-end circuit of an RF transceiver in accordance with one embodiment of the present invention.

FIG. 3 shows another structure of a front-end circuit of an RF transceiver in accordance with one embodiment of the present invention. Referring to FIG. 3, the front-end circuit 300 is disposed on a printed circuit board, and includes a first antenna ANT1; a second antenna ANT2; a first T/R switch 31; first, second, and third impedance matching networks 32, 33 and 34; first, second, and third baluns 35, 36 and 37; and a transceiver chip 38. The transceiver chip 38 includes second and third T/R switches 381 and 382, a receiver unit 383 and a transmitter unit 385. The receiver unit 383 includes a low-noise amplifier 384, which receives a differential input signal between a first input terminal INP and a second input terminal INN and generates a differential output signal. The transmitter unit 385 includes a power amplifier 386, which receives a differential input signal and generates a differential output signal between the first output terminal OUTP and the second output terminal OUTN. The first, second and third T/R switches 381, 382 and 383 can be implemented by an SPDT, which is composed of a single input/output terminal and two output/input terminals. As shown, the switches 381 and 382 are integrated in the chip 38. The first impedance matching network 32 and balun 35 are placed between the antenna ANT1 and the transceiver chip 38 so that the impedance of the antenna ANT1 can match the input-end impedance of the transceiver chip 38. The second impedance matching network 34 and second balun 37 are placed between the antenna ANT1 and the transceiver chip 38 so that the impedance of the antenna ANT1 can match the output-end impedance of the transceiver chip 38. The third impedance matching network 33 and third balun 36 are placed between the antenna ANT2 and the transceiver chip 38.

The front-end module 300 of an RF transceiver is operated in two modes, i.e. a receiving mode and a transmitting mode. Under the receiving mode, the receiver unit 383 receives RF signals from either the antenna ANT1 or the antenna ANT2. In the transmitting mode, the transmitter unit 385 transmits an RF signal to the antenna ANT1 or ANT2. If the RF signals come from the first antenna ANT1, the first T/R switch 31 connected to the first antenna is enabled, and the second and third T/R switches 381 and 382 in the chip 38 are disabled. As such, the first T/R switch 31 selectively switches the antenna to the input terminal of the first impedance matching network 32. Similarly, if the RF signals of the power amplifier 386 are transmitted through the antenna ANT1, the first T/R switch 31 selectively switches the output terminal of the second impedance matching network 34 to the antenna ANT1. As such, the received RF signals do not interfere with transmitted RF signals.

Figure 4:
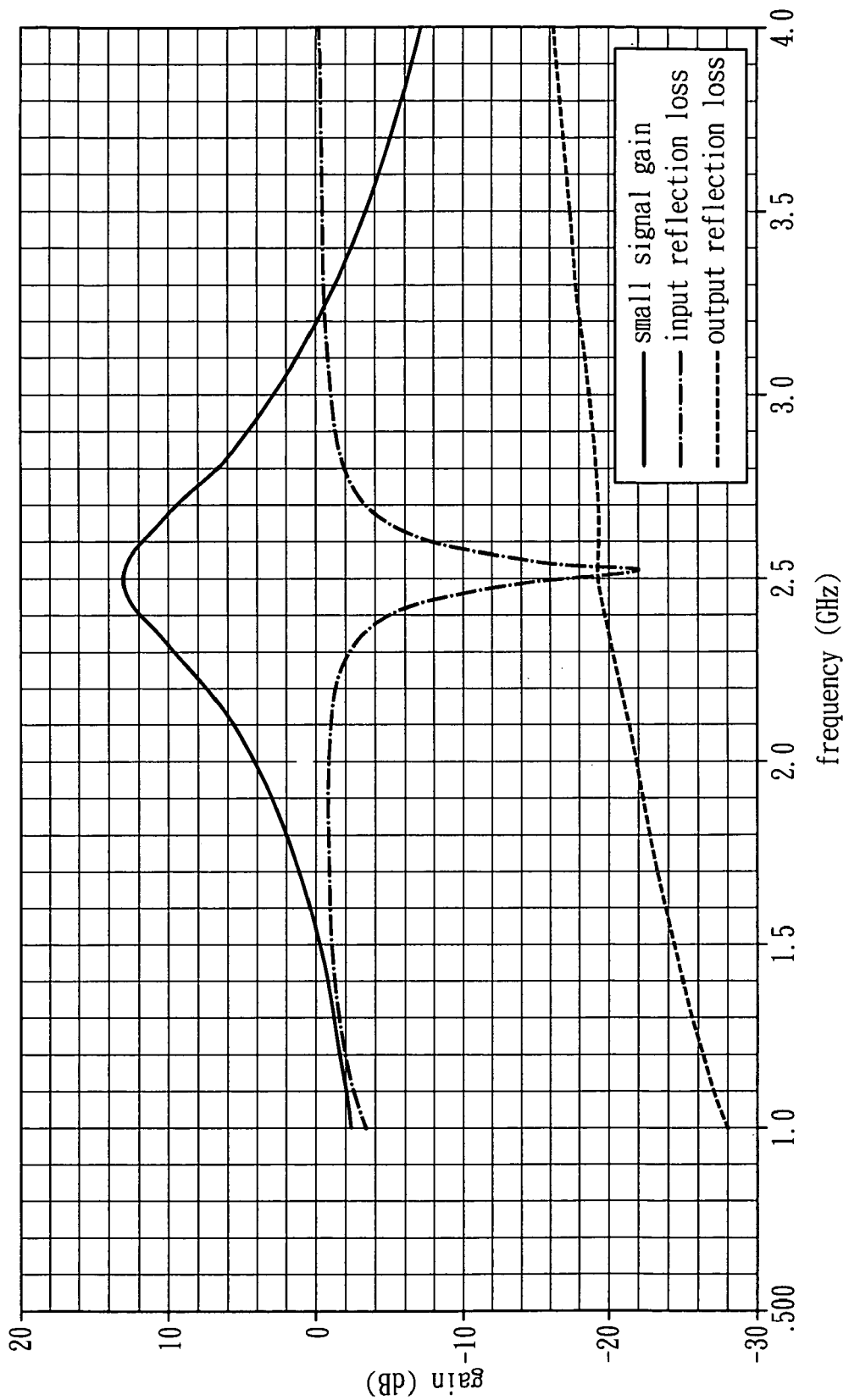
FIG. 4 shows measurement results of the small signal gain, input return loss and output return loss of the power amplifier in accordance with one embodiment of the present invention.
Figure 5:
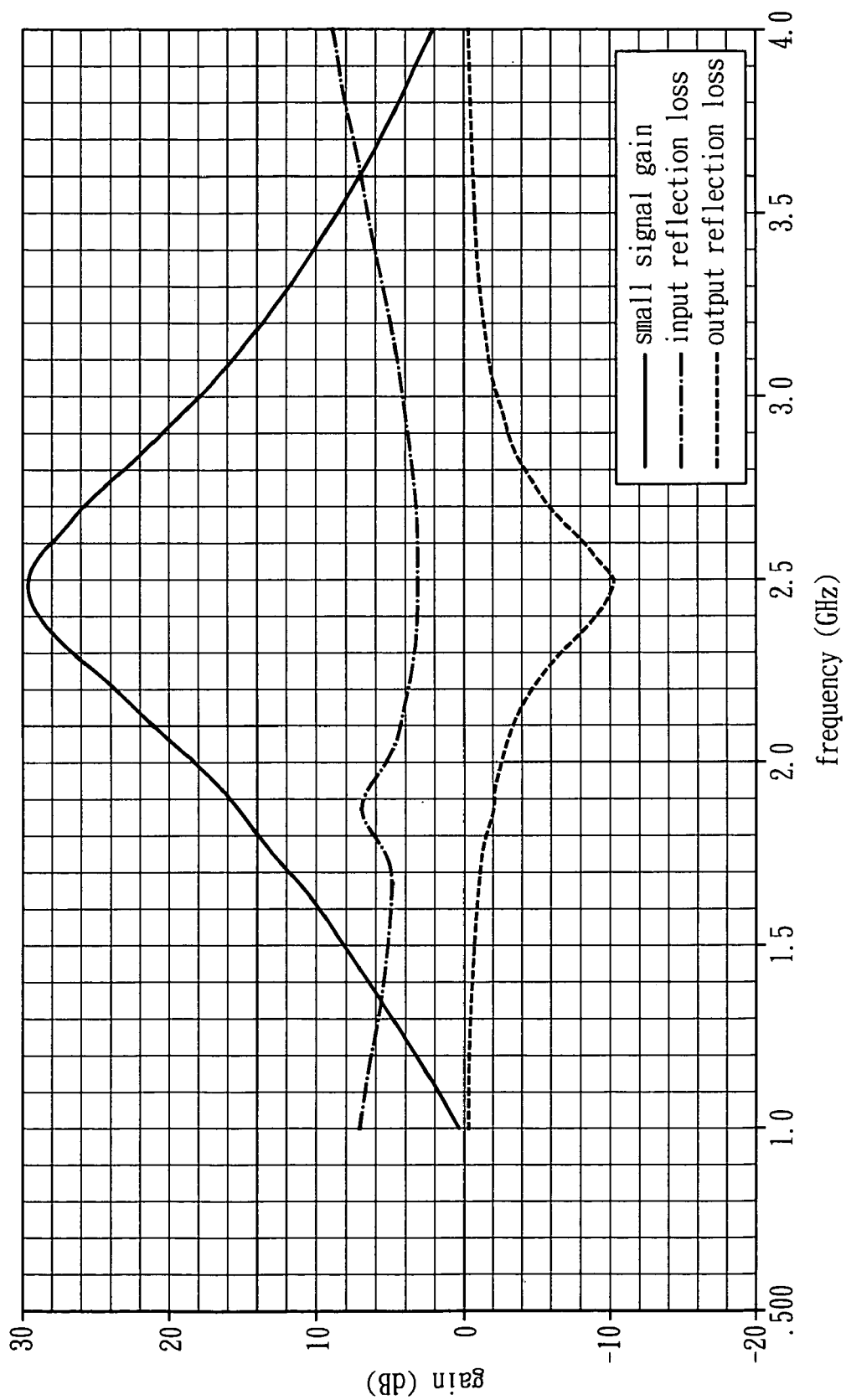
FIG. 5 shows measurement results of the small signal gain, input return loss and output return loss of the low noise amplifier in accordance with one embodiment of the present invention.

In another aspect, if the RF signals come from the second antenna ANT2, the second and third T/R switches 381 and 382 in the chip 38 are enabled, and the first T/R switch 31 connected to the first antenna ANT1 is disabled. Therefore, the second T/R switch 381 selectively switches the output terminal N3 of the third balun 36 to the first input terminal INP of the low-noise amplifier 384, and the third T/R switch 382 selectively switches the second input terminal INN of the low-noise amplifier 384 to the output terminal N4 of the third balun 36. Similarly, if the RF signals of the power amplifier 386 are transmitted through the antenna ANT2, the second T/R switch 381 selectively switches the first output terminal OUTP of the power amplifier 386 to the input/output terminal N3 of the third balun 36, and the third T/R switch 382 selectively switches the second output terminal OUTN of the power amplifier 386 to the input/output terminal N4 of the third balun 36. As such, the received RF signals do not interfere with transmitted RF signals. FIG. 4 shows a measurement result of the power amplifier 386 at 2.5 GHz in the transmitting mode and under the condition that the small signal gain is equal to 13 dB, the input return loss is equal to −19.3 dB and the output return loss is equal to −17.3 dB. FIG. 5 shows a measurement result of the low noise amplifier 384 at 2.5 GHz in the receiving mode in which the small signal gain is equal to 29.4 dB, the input return loss is equal to 3 dB and the output return loss is equal to −10.2 dB.

This embodiment combines a conventional structure and the first embodiment, and illustrates the signal transmission by taking ANT1 and ANT2 for example. However, the quantity of antennas actually used is not limited to two.

Figure 6:
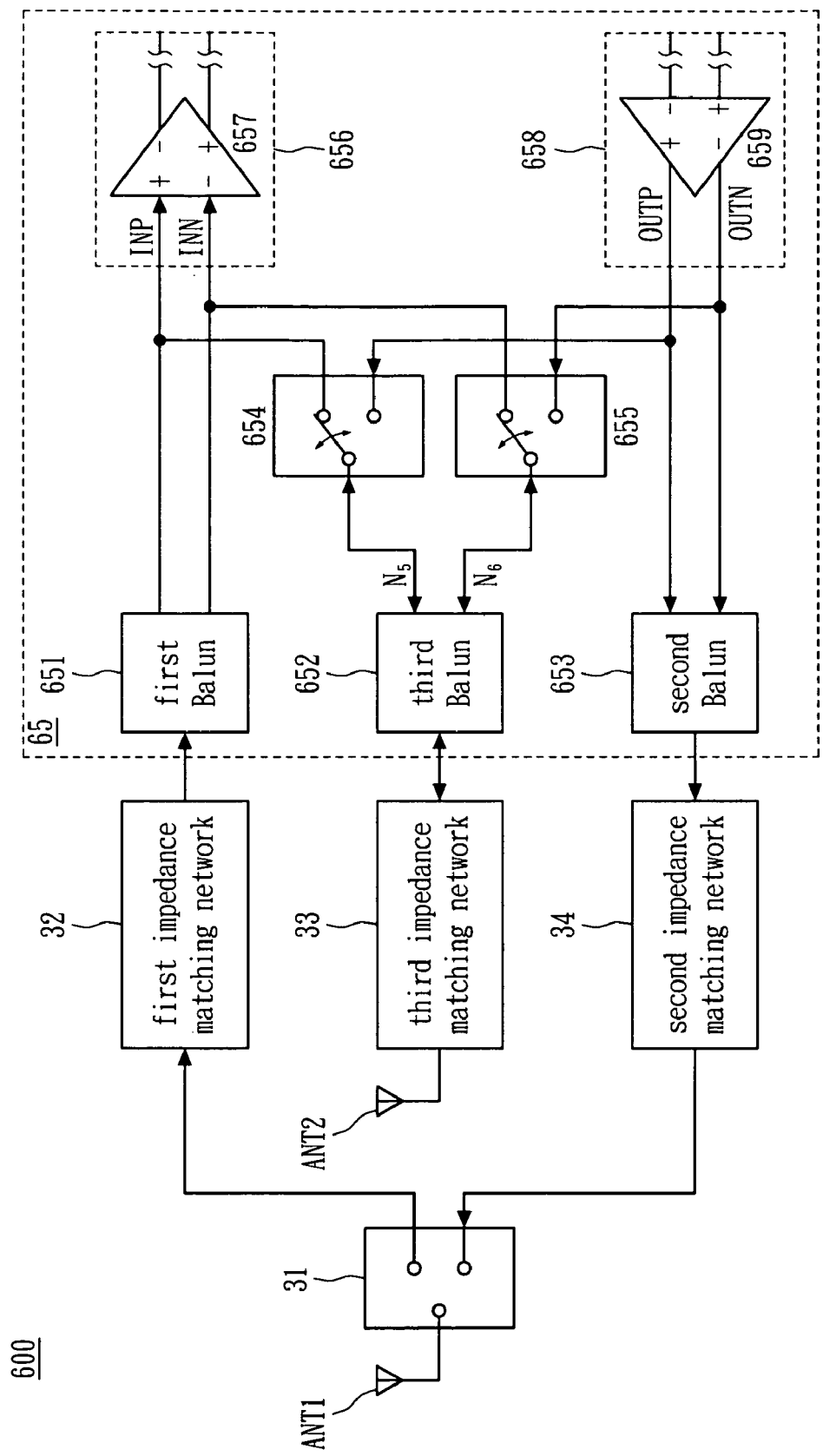
FIG. 6 shows another structure of a front-end circuit of an RF transceiver in accordance with another embodiment of the present invention.

FIG. 6 shows another structure of a front-end circuit of an RF transceiver in accordance with another embodiment of the present invention. Referring to FIG. 6, the front-end circuit 600 is similar to the front-end circuit 300 in FIG. 3. In this embodiment, a first balun 651, a second balun 652 and a third balun 653 are disposed in a transceiver chip 65. The transceiver chip 65 further comprises a second T/R switch 654 and a third T/R switch 655, a receiver unit 656 and a transmitter unit 658. The receiver unit 656 includes a low-noise amplifier 657, which receives a differential input signal between the first input terminal INP and the second input signal INN and thereby generates a differential output signal. The transmitter unit 658 includes a power amplifier 659, which receives a differential input signal and thereby generates a differential output signal between the first output terminal OUTP and the second output signal OUTN.

The above-described embodiments of the present invention are intended to be illustrative only. Numerous alternative embodiments may be devised by persons skilled in the art without departing from the scope of the following claims.

What is claimed is:

1. A circuit of a radio frequency (RF) transceiver comprising:
 a first antenna and a second antenna configured to selectively receive or transmit an RF signal;
 a first transmit/receive (T/R) switch connected to the first antenna;
 a transceiver chip including a receiver unit, a transmitter unit and a second T/R switch;
 a first impedance matching unit connected to the first T/R switch, the first impedance matching unit being configured to convert the RF signal of the first antenna into a first differential signal under a receiving mode of the first antenna and then to transmit the first differential signal to the receiver unit;
 a second impedance matching unit connected to the first T/R switch, the second impedance matching unit being configured to convert a second differential signal of the transmitter unit into the RF signal of the first antenna under a transmitting mode of the first antenna; and
 a third impedance matching unit configured to convert an RF signal of the second antenna into a third differential signal under a receiving mode of the second antenna and then to transmit the third differential signal to the receiver unit through the second T/R switch, and the third impedance matching unit configured to convert the third differential signal from the transmitter unit through the second T/R switch into the RF signal of the second antenna under a transmitting mode of the second antenna,
 wherein both the first impedance matching unit and the second impedance matching unit are coupled to the first antenna via the first T/R switch.

2. The circuit of claim 1, wherein the receiver unit comprises a first input end and a second input end, the transmitter unit includes a first output end and a second output end, and the transceiver chip further includes a third T/R switch, wherein the first input end of the receiver unit and the first output end of the transmitter unit are connected to the second T/R switch, and the second input end of the receiver unit and the second output end of the transmitter unit are connected to the third T/R switch.

3. The circuit of claim 2, wherein if the RF signal is received by the first antenna, the first T/R switch selectively switch the first antenna to the input end of the first impedance matching unit under the receiving mode, and the first T/R switch selectively switches the output end of the second impedance matching unit to the first antenna under the transmitting mode; if the RF signal is received by the second antenna, the second and third T/R switches selectively switch the differential signal of the third impedance matching unit to the first and second input ends of the receiver unit under the receiving mode, and the second and third T/R switches selectively switch the differential signal between the first and second output ends of the transmitter unit to the third impedance matching unit under the transmitting mode.

4. The circuit of claim 1, wherein the impedance matching unit includes an impedance matching network and a balance to unbalanced transformer (balun).

5. A circuit of a radio frequency (RF) transceiver comprising:
 a first antenna and a second antenna configured to selectively receive or transmit an RF signal;
 a first transmit/receive (T/R) switch connected to the first antenna;
 a first impedance matching network connected to the first T/R switch for matching a first input signal;
 a second impedance matching network connected to the first T/R switch for matching a first output signal;
 a third impedance matching network connected to the second antenna for matching a second input/output signal and connected to a second T/R switch and a third T/R switch
 to receive one of the first input signal and the second input/output signal under a receiving mode, and to transmit one of the first output signal and the second input/output signal under a transmitting mode,
 wherein both the first impedance matching unit and the second impedance matching unit are coupled to the first antenna via the first T/R switch.

6. The circuit of claim 5, further includes a receiver unit, a transmitter unit, a first balance to unbalanced transformer (balun), a second balun and a third balun;
 wherein the receiving unit includes a first input end and a second input end, the transmitter unit includes a first output end and a second output end, the first input end of the receiver unit and the first output end of the transmitter unit are connected to the second T/R switch, and the second input end of the receiver unit and the second output end of the transmitter unit are connected to the third T/R switch;

wherein the first balun is connected to the first impedance matching network and the receiver unit, the second balun is connected to the second impedance matching network and the transmitter unit, and the third balun is connected to the third impedance matching network and the second and third T/R switches.

7. The circuit of claim 6, wherein if the RF signal is received by the first antenna, the first T/R switch selectively switches the first antenna to the input end of the first impedance matching unit under the receiving mode, and the first T/R switch selectively switches the output end of the second impedance matching unit to the first antenna under the transmitting mode; if the RF signal is received by the second antenna, the second and third T/R switches selectively switch the differential signal of the third impedance matching unit to the first and second input ends of the receiver unit under the receiving mode, and the second and third T/R switches selectively switch the differential signal between the first and second output ends of the transmitter unit to the third impedance matching unit under the transmitting mode.

8. The circuit of claim 5, wherein the impedance matching network is implemented by a transformer, resistors, capacitors or inductors.

* * * * *